United States Patent
Alais

[11] 3,937,028
[45] Feb. 10, 1976

[54] MODULE FOR CONDITIONING AIR BY THE PELTIER EFFECT AND AIR CONDITIONING INSTALLATIONS COMPRISING SUCH MODULES

[75] Inventor: Michel Alais, Orsay, France

[73] Assignee: Compagnie Industrielle des Telecommunications Cit-Alcatel, France

[22] Filed: Sept. 18, 1974

[21] Appl. No.: 507,206

[30] Foreign Application Priority Data
Sept. 18, 1973 France .............................. 73.33429

[52] U.S. Cl. ..................... 62/3; 136/203; 136/204
[51] Int. Cl.² ........................................ F25B 21/02
[58] Field of Search .................. 62/3; 136/203, 204

[56] References Cited
UNITED STATES PATENTS

| | | |
|---|---|---|
| 2,903,857 | 9/1959 | Lindenblad ............................. 62/3 |
| 3,006,979 | 10/1961 | Rich ..................................... 62/3 |
| 3,040,539 | 6/1962 | Gaugler .................................. 62/3 |
| 3,137,142 | 6/1964 | Venema ................................. 62/3 |
| 3,213,630 | 10/1965 | Mole ..................................... 62/3 |
| 3,557,565 | 1/1971 | Kissel .................................... 62/3 |

*Primary Examiner*—William J. Wye
*Attorney, Agent, or Firm*—Craig & Antonelli

[57] ABSTRACT

Module for conditioning air by the Peltier effect, comprising a hot plate and a cold plate arranged face to face, divided into strip plates and both provided with ribs, the P and N thermoelements connected by the strip plates and arranged between the crests of the cold ribs and the crests of the hot ribs, the cold ribs are vertical and the hot ribs are vertical or horizontal. The air to be conditioned circulates by natural convection along the vertical ribs without forced ventilation.

21 Claims, 5 Drawing Figures

MODULE FOR CONDITIONING AIR BY THE PELTIER EFFECT AND AIR CONDITIONING INSTALLATIONS COMPRISING SUCH MODULES

The present invention relates to a module for conditioning air by the Peltier effect and to air conditioning installations comprising such modules.

It is known that there are devices for conditioning air by the Peltier effect comprising a conductor constituted by an alternate sequence of P and N thermoelements connected in series and provided at its ends with two direct current feed terminals, the cold (or hot) junctions of that conductor being in thermal contact with the air of the room.

These devices have the advantage of supplying heat and cold in a static manner but their operation is not free from all noise, as it is necessary to ventilate the air along junctions in thermal contact with the air in the room to be conditioned.

The air conditioning module of the Peltier effect type according to the invention has the advantage of operating without the necessity of ventilating junctions in contact with the air in the room.

That module comprises a conductor constituted by an alternate sequence of P and N thermoelements connected up in series and provided at its ends with two direct current feed terminals, characterized in that it comprises, moreover, a hot conductive plate provided with parallel hollow ribs, a cold conductive plate also provided with parallel hollow ribs and arranged opposite the hot plate, the ribs of the two plates being situated in the space comprised between the planes of the two plates, each of the thermoelements being arranged between the crest of a rib of the hot plate and the crest of a rib of the cold plate, the hot plate and the cold plate being divided into strip plates, each of the strip plates establishing an electrical contact between a thermoelement of the P type and a neighbouring thermoelement of the N type so as to form the said continuous conductor.

In the module according to the invention, the conductive strip plates fixed to the thermoelements also act as heat evacuating fins, these strip plates having surfaces which are several hundreds of times larger than the surface of the various junctions; moreover, due to the fact that ribs are used, the distance between the planes of the two plates is noticeably greater than the height of a thermoelement, this decreasing, to a great extent, the thermal coupling between the two plates and improving the operation of the module.

According to a first embodiment of the invention, the ribs of the hot plate are parallel to the ribs of the cold plate. It is thus possible to arrange these ribs vertically and the evacuation of the calories (or of the frigories) is made very much easier by the air which flows by natural convection along these ribs.

According to a second embodiment of the invention, the ribs of the hot plate are orthogonal to the ribs of the cold plate. Such modules are a particular advantage when used in air conditioning installations of two contiguous rooms. Indeed, two modules are arranged face to face in the partition separating the two rooms, the cold plates of each of the two modules being in contact with the air of one room to be climatized and the hot plates being arranged face to face.

The ribs of the cold plates are vertical, so much so that the air of the rooms, flowing by natural convection along the strip plates and the ribs, evacuates the frigories without there being any need to use a ventilator in any of the rooms. In the middle part between the hot plates, a horizontal air current is made to flow along the ribs and the hot strip plates. The air current is set up by a ventilator which may be situated outside the rooms.

The noise caused by that forced ventilation is slightly noticeable in the rooms, it being damped by the modules.

The following description with reference to the accompanying drawings will make it easier to understand how the invention may be brought into effect.

Figure 1:
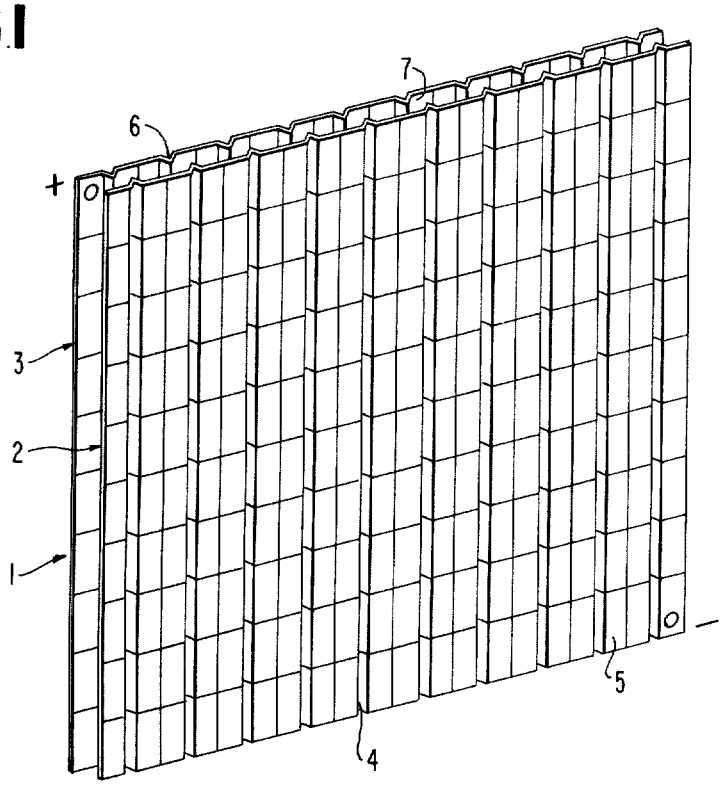
FIG. 1 shows an air conditioning module according to the invention.

The air conditioning module according to the invention, such as diagrammatically shown in FIG. 1, comprises a cold plate 2 and a hot plate 3 arranged face to face.

The cold plate 2 comprises parallel hollow ribs 4 and is separated into strip plates 5 which are electrically insulated from one another; likewise, the hot plate 3 comprises also parallel hollow ribs 6 and is separated into strip plates 7 which are electrically insulated from one another.

In FIG. 1, the ribs 4 and 6 of the cold plate 2 and hot plate 3 are parallel to each other.

Figure 2:
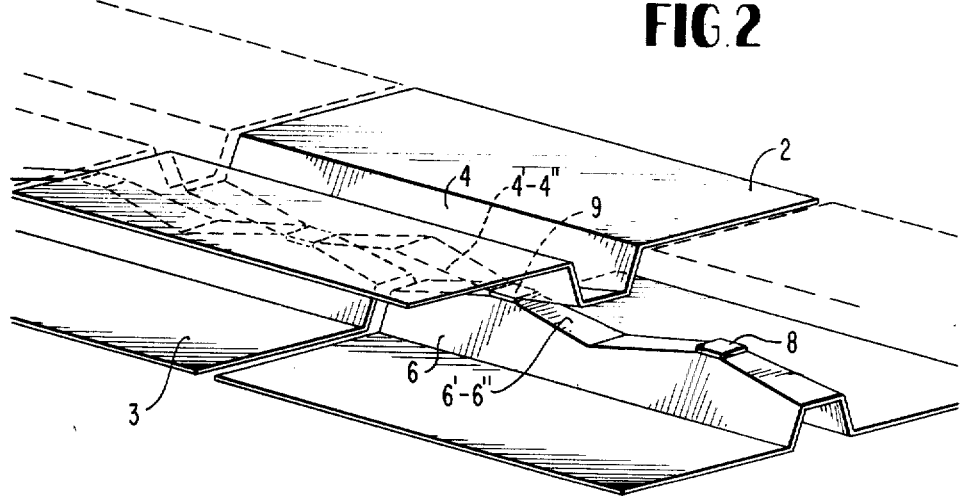
FIG. 2 is a detailed view of a part of the module in FIG. 1.

Positive thermoelements 8 and negative thermoelements 9 (see FIG. 2) are arranged between the crests 4' of the ribs 4 of the cold plate, each of the strip plates establishing an electrical contact between a positive thermoelement and a neighbouring negative thermoelement.

Each plate is provided with an electric therminal, + for the one and — for the other, to which a direct current is applied.

The thermal coupling between the two plates is slight, as they are set apart from each other. In order to reduce that thermal coupling, ribs whose bottom 4'', 6'' is corrugated, the depth of the ribs being maximum at the points of contact with the thermoelements are used.

Figure 3:
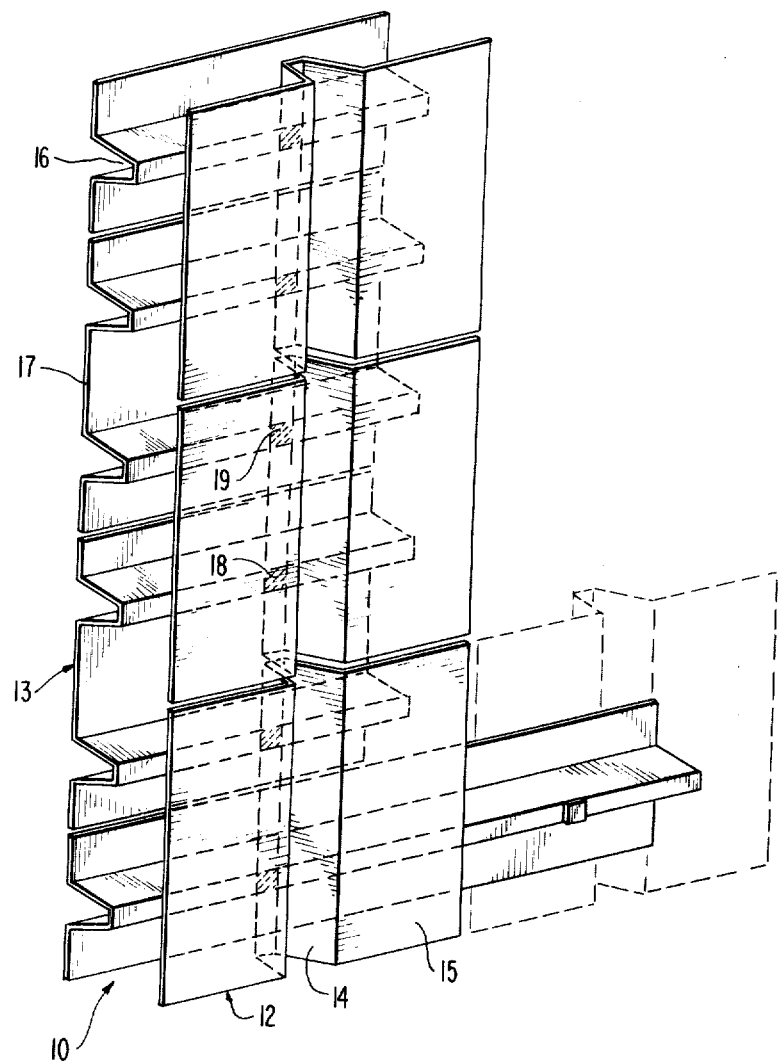
FIG. 3 shows a variant of the module for conditioning air according to the invention.

A second possible embodiment of the module according to the invention is shown in FIG. 3. According to that other embodiment, the module 10 comprises two plates, cold and hot, 12 and 13, the cold plate 12 comprising parallel hollow ribs 14 and being divided up into strip plates 15 which are electrically insulated and the hot plate comprising parallel hollow ribs 16 and being divided up into strip plates 17, the ribs 14 being orthogonal with the ribs 16.

Positive thermoelements 18 and negative thermoelements 19 are arranged at the crossing points between the crests of the ribs 14 and 16, each of the strip plates establishing an electrical contact between a positive element and a neighbouring negative element.

The operation of the air conditioning module according to the invention is as follows;

When a direct current is applied to the conductor formed by the alternate sequence of positive and negative thermoelements connected up in series through strip plates, the strip plates of one of the plates are brought to a temperature lower than that of the strip plates of the other plate, because of the Peltier effect.

The plate in contact with the air to be conditioned is arranged vertically with its ribs vertical. Assuming that this plate is the cold plate, the strip plates which are of very great size in relation to the thermoelements acts as fins for the evacuation of frigories.

The air inside the part in contact with the cold plate has a tendency to fall and it cools on falling, so that an air flow in a vertical direction, from top to bottom, is produced naturally along the ribs of the cold plate.

When the ribs of the hot plate are vertical (FIG. 1) ascending air current is naturally produced in contact with that plate and along the ribs. That air current evacuates the calories of the plate.

The hot plate side of the module is arranged with in contact with the air which is not to be climatized.

On reversing the flow direction of the current, the function of the plates is reversed, so that an ascending air current which is heated up on rising is produced against the hot plate in contact with the air to be climatized, whereas a descending current which evacuates the frigories of that cold plate is produced against the cold plate not in contact with the air to be climatized.

In the case where the ribs of the plate not in contact with the air to be climatized are horizontal (FIG. 3), the ascending current or descending current is formed improperly, because of the direction of the ribs. That is why it is an advantage to provide a lateral ventilation causing a lateral ventilation driving a horizontal air current passing along these ribs and evacuating the calories (or the frigories, according to the direction of the direct supply current) of that plate.

The noise caused by that ventilation is only slightly perceptible in the room, as it is damped by the thickness of the module.

Figure 4:
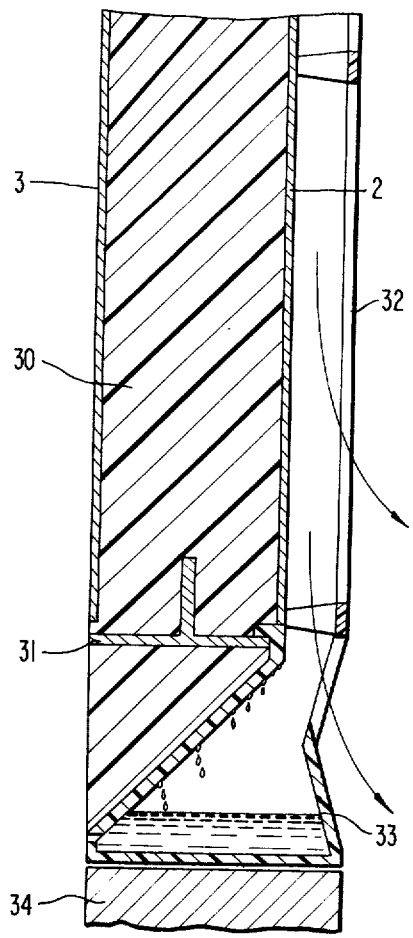
FIG. 4 is a more detailed cutaway view of the module according to the invention.

FIG. 4 shows a cutaway view of a module shown in greater detail.

The space between the hot plate and the cold plate is filled with an insulating foam 30 (for example, expanded polyurethane) this conferring a certain solidity on the module and increasing the heat insulation between the two plates.

That module is surrounded by a metallic frame 31 not in contact with the plates. An insulating trellis 32 has been arranged in front of the plate in contact with the air to be climatized, for example, the cold plate and the air which is cooled flows in the direction of the arrows shown in the figure.

A trough 33 used for collecting condensed water vapour which flows along the plate in contact with the air to be conditioned is arranged in the lower part of the module. The module may be arranged in the thickness of the partition 34.

Figure 5:
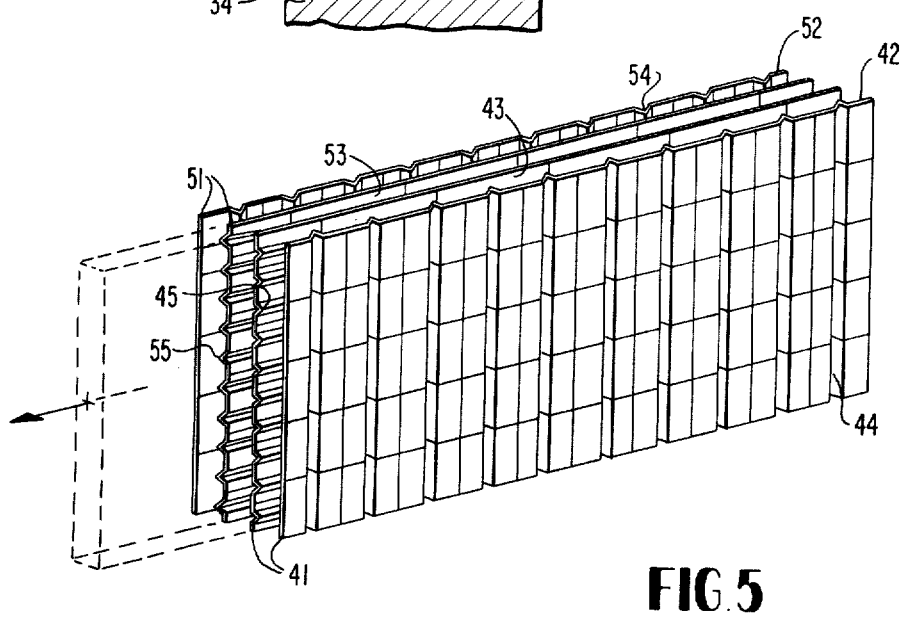
FIG. 5 shows an air conditioning installation according to the invention.

FIG. 5 shows diagrammatically an air conditioning installation for two contiguous rooms.

In these cases, two modules (or groups of modules) 41, 51 are arranged face to face in the partition separating the two rooms.

The two modules are of the type shown in FIG. 3, that is, having the ribs of one plate orthogonal to the ribs of the other plate.

A space is left between the two modules. The two modules have been arranged so that this space be limited by two plates 43, 53 whose ribs 45, 55 are horizontal, so that the plates 42, 52 in contact with the air to be conditioned in the two rooms have vertical ribs 44, 54.

It is thus possible to reduce or increase simultaneously the temperature of the two parts, providing forced ventilation means for the air in the space between the two modules. That air evacuates the calories (or the frigories) of the two inside plates.

Although the air conditioning modules which has just been described may appear to afford the greatest advantages for implementing the invention, it will be understood that various modifications may be made thereto without going beyond the scope of the invention, it being possible to replace certain of its elements by other elements capable of fulfilling the same technical function or an equivalent technical function therein.

I claim:

1. Module for air conditioning by the Peltier effect comprising a conductor constituted by an alternate sequence of P and N thermoelements connected in series and provided at its ends with two direct current feed terminals characterized in that said module comprises, moreover, a hot conductive plate provided with parallel hollow ribs, and a cold conductive plate also provided with parallel hollow ribs, said cold conductive plate arranged in separated facing relationship to said hot plate, wherein said parallel hollow ribs of each of said two plates project between the space comprised between the planes of the two plates, each of the thermoelements being in direct contact with the crest of one rib of said hot plate and with the crest of one rib of the cold plate, the hot plate and the cold plate being divided into strip plates, each of the strip plates establishing an electrical contact between a thermoelement of the P type and a neighbouring thermoelement of the N type so as to form said continuous conductor.

2. Module for conditioning air by the Peltier effect according to claim 1, characterized in that the ribs of the hot plate are parallel to the ribs of the cold plate.

3. Module for air conditioning by the Peltier effect according to claim 2, characterized in that the bottoms of the ribs of the hot plate end of the cold plate are corrugated, the depth of the ribs being at its maximum at the point of contact with the thermoelements.

4. Module for air conditioning by the Peltier effect according to claim 1, characterized in that the ribs of the hot plate are orthogonal to the ribs of the cold plate.

5. Module for air conditioning by the Peltier effect according to claim 2, characterized in that the space comprised between the two plates is filled with an insulating foam.

6. Module for conditioning air by the Peltier effect according to claim 5, characterized in that the insulating foam is expanded polyurethane.

7. Module for conditioning air by the Peltier effect according to claim 2, characterized in that it comprises a rigid frame electrically insulated from the hot plate and cold plate.

8. Module for conditioning air by Peltier effect according to claim 2, characterized in that one of the plates is covered with a trellis made of insulating material.

9. Air conditioning installation comprising several modules according to claim 2 forming a vertical partition, characterized in that the ribs of the plates of the various modules are vertical.

10. Air conditioning installation for two contiguous rooms separated by a partition comprising several modules according to claim 4, characterized in that the partition is formed by two groups of modules arranged in two vertical planes, the cold plates of each of the groups being in contact with the air of each of the two rooms and the hot plates of each of the two groups being arranged one facing another, the ribs of these hot plates being horizontal and in that it comprises, moreover, air suction means situated between the hot plates of the 2 groups of modules.

11. Module for air conditioning by the Peltier effect according to claim 3, characterized in that the space comprised between the two plates is filled with an insulating foam.

12. Module for air conditioning by the Peltier effect according to claim 11, characterized in that the insulating foam is expanded polyurethane.

13. Module for air conditioning by the Peltier effect according to claim 3, characterized in that it comprises a rigid frame electrically insulated from the hot plate and cold plate.

14. Module for air conditioning by the Peltier effect according to claim 3, characterized in that one of the plates is covered with a trellis made of insulating material.

15. Air conditioning installation comprising several modules according to claim 3, forming a vertical partition, characterized in that the ribs of the plates of the various modules are vertical.

16. Module for air conditioning by the Peltier effect according to claim 4, characterized in that the space comprised between the two plates is filled with an insulating foam.

17. Module for air conditioning by the Peltier effect according to claim 16, characterized in that the insulating foam is expanded polyurethane.

18. Module for air conditioning by the Peltier effect according to claim 4, characterized in that it comprises a rigid frame electrically insulated from the hot plate and cold plate.

19. Module for air conditioning by the Peltier effect according to claim 4, characterized in that one of the plates is covered with a trellis made of insulating material.

20. Module for air conditioning by the Peltier effect according to claim 1, wherein each of said thermoelements is in direct electrical and thermal contact with the respective crests of said one rib of each of said hot and cold plate.

21. Module for air conditioning by the Peltier effect according to claim 1, wherein said parallel hollow ribs of the respective hot and cold plates form a heat exchanger by air flow through said hollow ribs.

* * * * *